United States Patent [19]

De Young et al.

[11] Patent Number: 5,260,639
[45] Date of Patent: Nov. 9, 1993

[54] METHOD FOR REMOTELY POWERING A DEVICE SUCH AS A LUNAR ROVER

[75] Inventors: Russell J. De Young, Newport News; Michael D. Williams, Hampton; Gilbert H. Walker, Gloucester Point; Gregory L. Schuster, Norfolk; Ja H. Lee, Newport News, all of Va.

[73] Assignee: The United States of America as represented by the Administrator of the National Aeronautics and Space Administration, Washington, D.C.

[21] Appl. No.: 822,457

[22] Filed: Jan. 6, 1992

[51] Int. Cl.$^5$ ............................................ B64G 1/10
[52] U.S. Cl. .................................. 322/2 R; 244/1 R; 372/43
[58] Field of Search ............... 322/2 R; 244/62, 172, 244/1 R; 372/43

[56] References Cited

U.S. PATENT DOCUMENTS

| | | | |
|---|---|---|---|
| 3,825,211 | 7/1974 | Minovitch | 244/62 X |
| 3,933,323 | 1/1976 | Dudley et al. | 244/1 R |
| 3,989,994 | 11/1976 | Brown | 322/2 R |
| 4,305,555 | 12/1981 | Davis | 244/158 R |
| 4,368,415 | 1/1983 | Henderson et al. | 322/2 R |
| 4,414,558 | 11/1983 | Nishizawa et al. | 357/17 |
| 4,638,110 | 1/1987 | Erbert | 136/246 |

OTHER PUBLICATIONS

NASA Conference Publication 3037-"Second Beamed Space-Power Workshop excerpts". 1989; Harries et al, Laser Powered Martian Rover (pp. 317-327); Overview of Laser Concepts by Conway (pp. 261, 269, 277); Earth Orbit Laser Systems by Lee (pp. 377-381); and Space Station Powered by a Nuclear Electric Diode Laser by Lee (pp. 431-434).
NASA Technical Paper 2922 by Williams et al, "Diode Laser Satellite Systems for Beamed Power Transmission", 1990, Jul.
Rather, John D. G., "New candidate lasers for power beaming and discussion of their applications"; Radiation Energy Conversation in Space, vol. 61, Progress in Astronautics and Aeronautices, Billman and Summerfield, Eds., prepared for 3rd NASA Conf. on Radiation Energy Conversion; Ames Res. Ctr, Jan. 26–28, 1978.
van der Ziel, et al, "Characteristics of Single- and Two-Dimensional Phase Coupled Arrays of Vertical Cavity Surface Emitting GaAs–AlGaAs Lasers", IEE J. of Quantum Electronics, vol. 26, No. 11, Nov. 1990, pp. 1873–1882.
Williams, M. D., Proposed NASA Technical Memorandum (Rough Draft), "Analysis and Development of Dynamic Selection of Laser Array Elements", 1992.
Kwon, J. H., et al "Far-field pattern of a choherently combined beam from large-scale laser diode arrays", J. Appl. Phys. 69(3), Feb. 1991, pp. 1177–1182.
French, E. P., "Heat Rejection design for large concentrating solar arrays" Proceeding of the 15th Intersociety Energy Conversion Engineering Conference Seattle, Wash., Aug. 18–22, 1980, pub. AIAA, 1980, pp. 394–398.
Aftergood, S., "Background on space nuclear power", Science & Global Security, vol. 1, 1989, pp. 93–107.
Cintala, M. J. et al, "Advanced geologic exploration supported by a lunar base: A traverse across the imbrium-procellarum region of the moon," Lunar Bases and Space Activites of the 21st Century, W. W. Mendell, Ed., Lunar and Planetary Institute, Houston, 1985, pp. 223–237.

*Primary Examiner*—R. J. Hickey
*Attorney, Agent, or Firm*—Kevin B. Osborne

[57] ABSTRACT

A method of supplying power to a device such as a lunar rover located on a planetary surface is provided according to the present invention. At least one, and preferably three, laser satellites are set in orbit around the planet. Each satellite contains a nuclear reactor for generating electrical power. This electrical power is converted into a laser beam which is passed through an amplifying array and directed toward the device such as a lunar rover. The received laser beam is then converted into electrical power for use by the device.

6 Claims, 7 Drawing Sheets

METHOD FOR REMOTELY POWERING A DEVICE SUCH AS A LUNAR ROVER

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

1. Technical Field of the Invention

The present invention relates generally to supplying power to a user from a remote position and more particularly to a method of remotely powering a device such as a lunar rover.

2. Discussion of the Related Art

Interest in building a permanent lunar base has substantially increased. Such a base would be a test bed for future Mars missions and would also be used for extensive science and exploration missions on the lunar surface. The lunar base would be a fixed, permanent structure with much surrounding infrastructure. However, this cannot satisfy the needs of geologists and other planetary scientists who would like to visit many distant lunar locations with minimum infrastructure and maximum mobility. Assaying lunar resources for potential commercialization would also require high mobility. Such needs have made the concept of the long-distance lunar rover attractive. The rover would be required to support four crew members for several weeks to months, have good mobility for long-distance missions, and provide adequate power for performing detailed science analysis and crew support. The potential advantages of such a rover, from a geologist's point of view, are detailed in a proposed lunar science mission by Cintala, Spudis, and Hawke in "Advanced Geologic Exploration Supported by a Lunar Base: A Traverse Across the Imbrium-Proellarum Region of the Moon", found in *Lunar Bases and Space Activities of the 21st Century*, W. Mendell, Ed., Lunar and Planetary Institute Press, pp. 223-37, 1985. This proposed lunar expedition would traverse the Imbrium Basin and its environs for a total route distance of almost 4,000 km, visiting 29 separate localities in an attempt to characterize the process involved in the formation and evolution of the lunar surface. This trip equals approximately 37 percent of the Moon's circumference of 10,933 km. No details concerning the rover to accomplish this mission or its power source were given in the proposal.

Previous rover studies have focused on advanced rovers powered by nuclear reactors and fuel cells. The most detailed study to date was done by Eagle Engineering, Inc. and is contained in NASA Contractor Report No. 172,077, July, 1988, entitled "Lunar Surface Transportation System Conceptual Design, Lunar Base Systems Study Task 5.2". There, the long-duration rover was made up of eight vehicles linked together having a total mass of 17,560 kg. The train configuration consisted of a primary control vehicle, a habitation trailer unit, five auxiliary power carts providing 25 kW and 7000 kW-h of energy to the train, and finally an experiment and sample trailer. Power was supplied by fuel cells which made up one-third (5900 kg) of the total system mass. In addition, this rover could accomplish a 3000-km round trip, 42-day mission with a crew of four at a maximum speed of 15 km/hr. No provision was made in this study for the mass of equipment needed to generate the $H_2$ and $O_2$ reactants for the fuel cells. This additional mass component could significantly increase the "total" system mass.

Rovers powered by nuclear reactors capable of providing 25 kW of electric power have large masses due to the required nuclear shielding of the reactor. Also, since the total reactor usually is not shielded, the unshielded area behind the reactor is not accessible to rover personnel. Rovers powered by solar photovoltaics at 25 kW of electricity would require 81 $m^2$ of solar array. Such an array would be much larger than the rover and have high mass. This rover would not be able to operate at lunar night unless there was a large storage capability on board.

Laser-power-beaming studies have shown that significant payoff can be achieved by decoupling the prime power source from the user. More flexible power infrastructures are achieved for a variety of space missions, including powering of low power robotic rovers to high power laser propulsion.

OBJECTS

It is accordingly an object of the present invention to provide the necessary power requirements for a user such as a lunar rover while maintaining a low weight power system at the user site.

It is another object of the present invention to provide power to a user from a remote prime power source.

It is a further object of the present invention to provide power to a user located at nearly any point on a planet.

It is another object of the present invention to effectively dissipate waste heat generated by this power system.

Other objects and advantages are apparent from the drawings and specification.

SUMMARY OF THE INVENTION

The foregoing and additional objects are achieved by a method of supplying power to a device such as a lunar rover vehicle located on a planetary surface according to the present invention. At least one, and preferably three, satellites are set in orbit around the planet. Each satellite contains a nuclear reactor for generating electrical power. This electrical power drives a large laser diode array creating a laser beam which is directed toward the device on the planet surface. The received laser beam is then converted into electrical power for use by the device.

DETAILED DESCRIPTION

Figure 1:
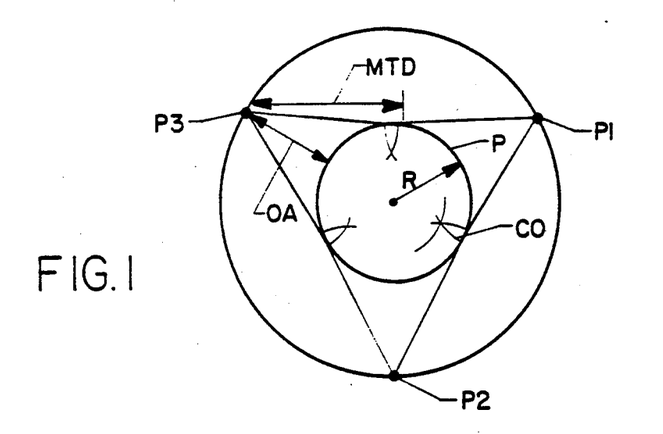
FIG. 1 is a schematic of three satellites comprising a nuclear reactor/laser diode array system which orbits a planet and transmits laser power to the surface.

In order to provide continuous power to a planetary traverse rover vehicle as described above, it is necessary to have three laser power station satellites P1, P2, and P3 equally spaced in an orbit around the planet P which is inclined 20° to the planetary equator. The orbit altitude OA for a lunar implementation is 1,815 km and corresponds to the minimum laser transmission distance; the maximum transmission distance MTD to the lunar horizon is 3,100 km. Such an orbit will provide ±12° of coverage overlap CO on each side of the orbit plane which allows beaming to the device, e.g., a lunar rover, at any point on the specific traverse. The lunar satellite orbital period is 5.3 hours. Each station will provide power to the rover for approximately 1.76 hours. The laser would require propulsion power to minimize orbit precession.

With this orbital configuration, only one laser satellite system is used at at time to beam power to the rover. The reserve power is not tied to any specific mission but provides a flexible method of powering other diverse missions. An additional advantage of this laser-transmitter-design concept is that the laser system could be assembled and completely checked out in low-Earth orbit before being transported to a planetary orbit.

Figure 2:
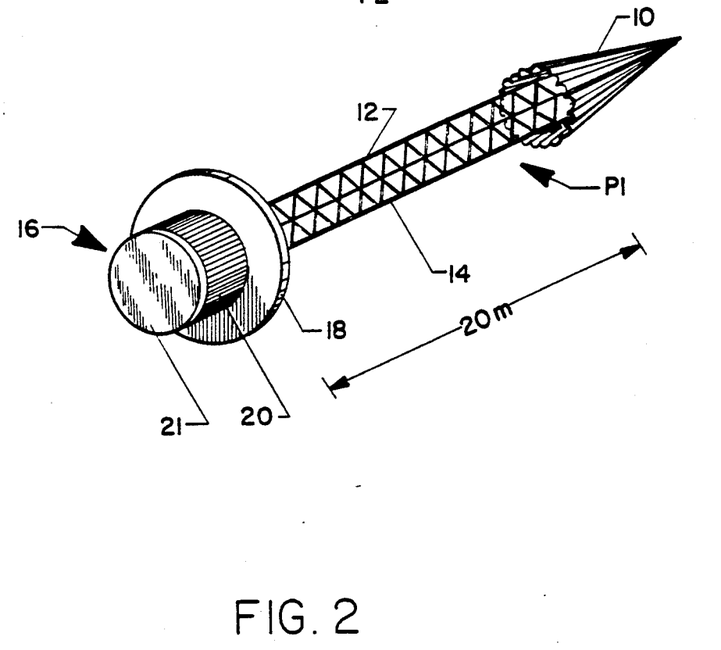
FIG. 2 is a perspective view of a satellite used in the present invention.

Referring now to FIG. 2, an enlarged power station satellite P1 is shown. A nuclear power source 10 is provided for generating electrical power for the laser power satellite. The prime power source for a proposed embodiment is the SP-100 nuclear reactor which is being developed by NASA, the Department of Defense, and the Department of Energy. This system is in the development stage and is an ideal source of electrical power to the laser transmitter chosen. The reactor provides 100 kW of electrical power at ±200 VDC via a cable 12 across a 20-m boom 14 to a laser transmitting device 16. In the depicted configuration, the boom 14 spans end-to-end between the reactor 10 and the laser device 16. The reactor mass is approximately 4000 kg, including the internal reactor shield. Since the reactor would remain in planetary orbit, there would be very little probability of contamination of the planet surface. Also, since no vehicle for transportation to the surface is needed, both mass and cost are saved. The heat loading from the reactor is 0.14 W/cm$^2$, the gamma dose is $5 \times 10^5$ rads, and the integrated (seven full power years) fast neutron fluence is $4 \times 10^{12}$ neutrons/cm$^2$, as described in "Background on Space Nuclear Power," S. Aftergood, *Science and Global Security*, Vol. 1, 1989, pp. 93–107.

There are a number of laser transmitter devices that could be used with the SP-100 reactor prime power source. In one embodiment of the present invention, a laser diode array concept was selected due to its rapidly maturing technology base which has produced single diode lasers with approximately 50 percent electric-to-laser conversion efficiency. They are also low mass devices that can be mass-produced. The laser wavelength is typically 0.8 μm, which is a reasonably good wavelength to minimize the size of the laser transmission optics, and solid-state photovoltaic converters on the rover can readily convert the laser beam into electricity. An example array is described below and also in NASA Technical Paper 2992, July, 1990, entitled "Diode Laser Satellite System for Beamed Power Transmission," by M. D. Williams, J. H. Kwon, G. H. Walker and D. H. Humes.

Figure 3A:
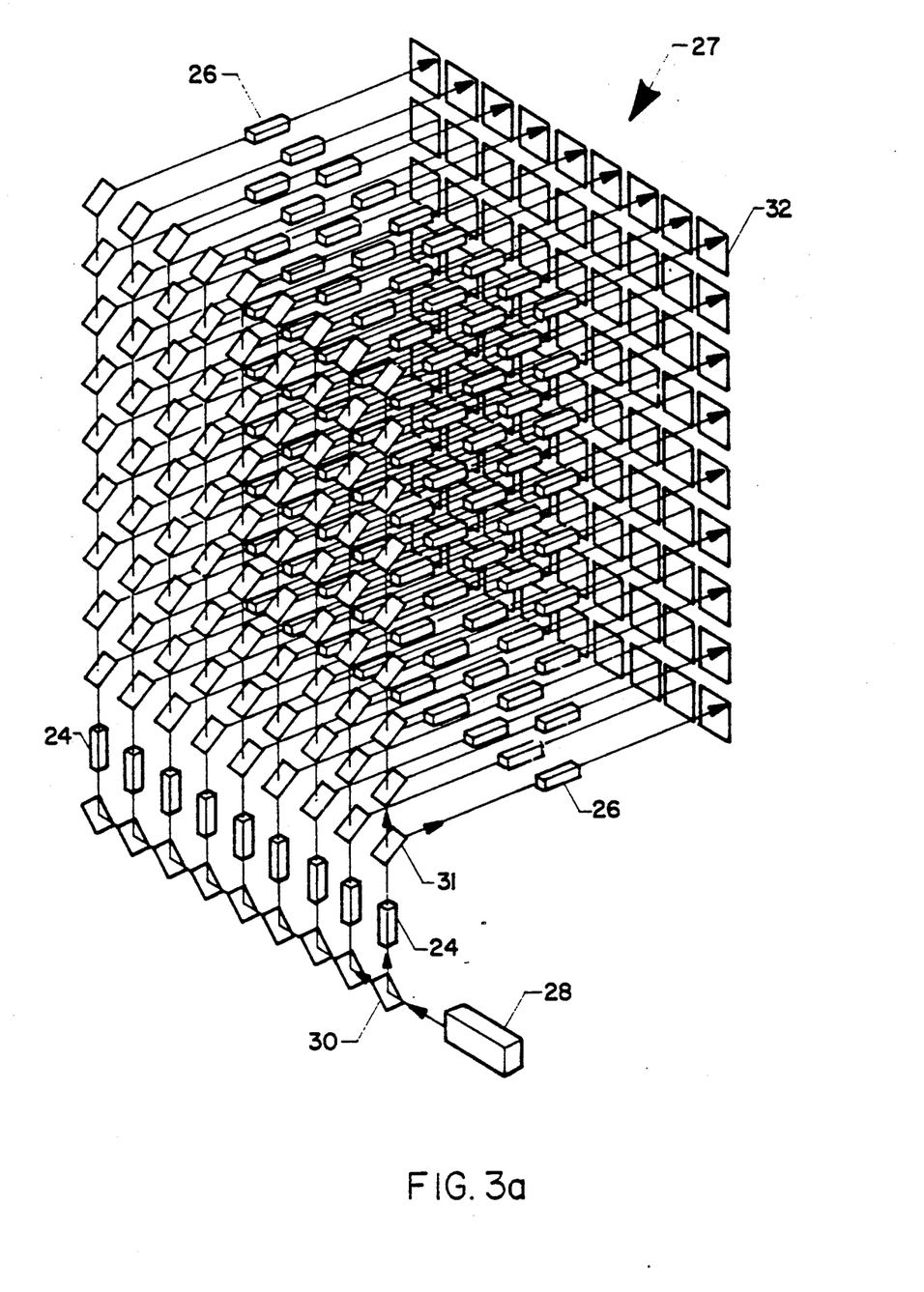
FIGS. 3a and 3b are perspectives of components of the laser diode array used in the present invention.
Figure 3B:
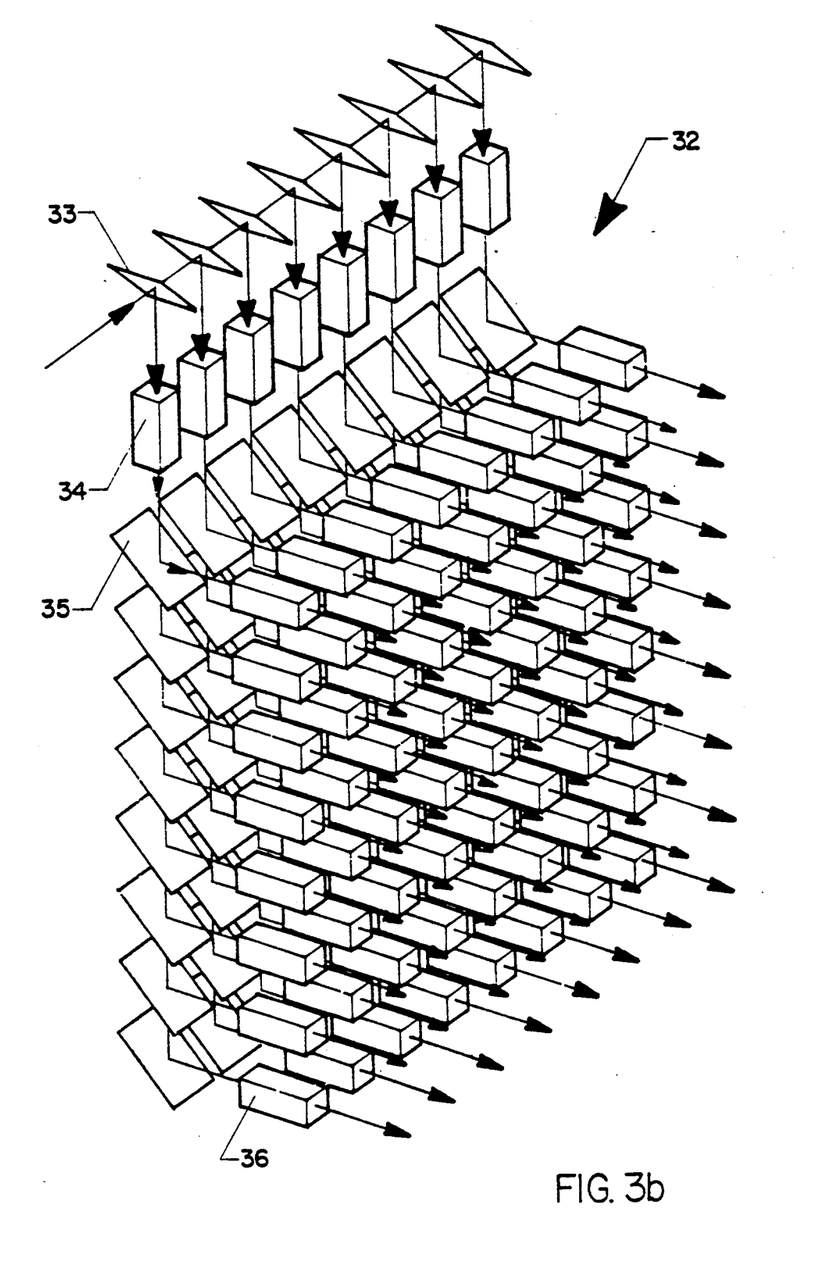

A heat shield 18 reflects heat from the power source 10, away from a laser diode array (not shown in FIG. 2) surrounded by a 126 m$^2$ radiator 20. As partially shown in FIGS. 3a and 3b, the laser diode array 22 comprises 5,926 individual laser diode amplifiers, all phase-locked to produce a single coherent beam, which is focused by the gas lens 21 onto the lunar rover receiver. Referring now to FIG. 3a, a 9×9 array 27 is shown. A well stabilized master oscillator 28 injects a 9W beam into a beam-splitter chain indicated by the directional arrows. Beam splitters 30 divide the beam into nine 1W separate beams that are applied to the first-stage amplifiers 24. Each amplified beam (9W) is then split into nine 1W beams by beam splitters 31, which are then injected into second-stage amplifiers 26. The second stage amplifies each beam to 8W. The result is 81 beams, each at 8W, which are now sent to the output diode arrays 32. FIG. 3b shows one 8×8 output array 32. Each 8W beam is split into eight 1W beams by beam splitter 33 and applied to the third amplifier stage. The output of each third-stage amplifier 34 is split into eight beams by beam splitter 35 and injected into the fourth-stage amplifiers 36 (gain of 10). The output of all the 8×8 amplifier arrays 32 is a phase-locked, single beam with a power of approximately 50 kW. This beam has an aperture of 8 m×8 m. A gas lens 21 is used to focus this beam onto the lunar rover laser-to-electric receiver producing a 0.62-m-square spot size at the lunar rover over a maximum transmission distance MTD of 3,199 km, as discussed below.

Figure 4:
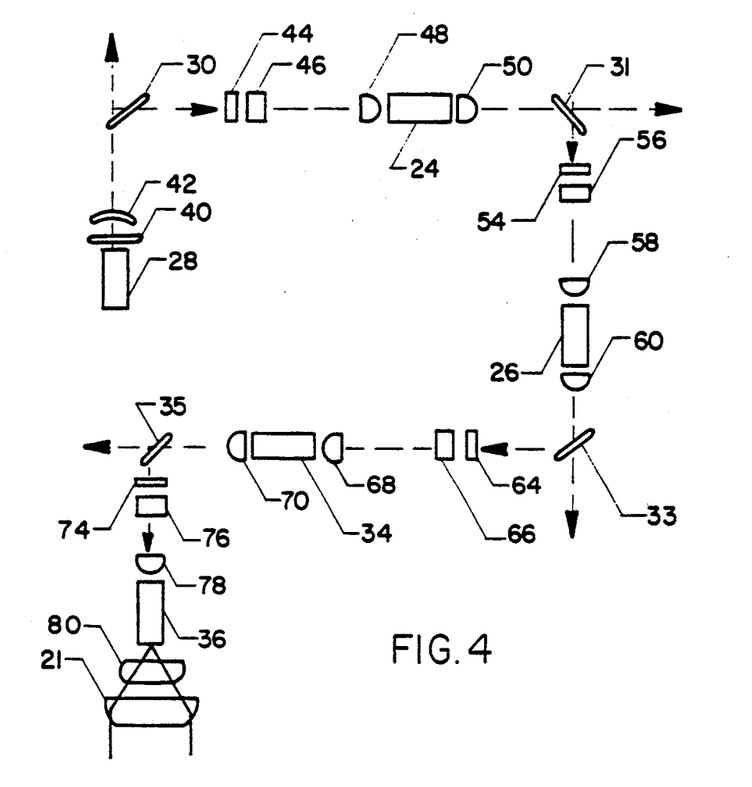
FIG. 4 is a schematic of the array design of FIGS. 3a and 3b.

One complete amplifier chain is shown in FIG. 4. Additional optical isolation and focusing elements are shown to ensure that there is no unwanted optical feedback through the amplifier chain. Focusing optics are also needed to input the beam into the small diode amplifier region. The master oscillator 28 generates a beam (9W) which passes through a cylindrical lens 40 and collimator 42 and beam splitter 30. The split beam (1W, one of nine) is directed through a polarizer 44, quarter wave plate 46 and focusing lens 48 prior to entering first-stage amplifier 24. The amplified beam (9W, one of nine) passes through a lens 50 and another beam splitter 31 and then the split beam (1W, one of 81) passes through another polarizer 54, quarter wave plate 56 and focusing lens 58 before entering second stage amplifier 26. The amplified beam (8W, one of 81) then passes through a lens 60 and beam splitter 33 and then the split beam (1W, one of 648) passes through another polarizer 64, quarter wave plate 66 and focusing lens 68 before entering third-stage amplifier 34. The amplified beam (8W, one of 648) then passes through lens 70 and beam splitter 35, and then the split beam (1W, one of 5184) passes through another polarizer 74, quarter wave plate 76 and focusing lens 78 before entering the fourth-stage amplifier 36. The amplified beam then (10W, one of 5184) passes through a cylindrical lens 80 and through gas output lens 21. The pointing accuracy is assumed to be 0.2μ radians.

The laser transmitter system has a mass breakdown as shown in Table I. The total mass of the laser diode array is approximately 849 kg. This mass is then added to the other laser transmitter component masses, as shown in Table II, for a total laser transmitter mass of approximately 4989 kg.

TABLE I

Mass of Single Laser Diode Array

| Diode Array Component | Mass (kg) |
|---|---|
| 1. Diode laser (5,926 units) | 154 |
| 2. Cylindrical lens pairs (6,661 units) | 67 |
| 3. Output cyclindrical lens pair (5,184 units) | 213 |
| 4. Partially reflecting mirrors (6,003 units) | 60 |
| 5. Optical isolators (5,922 units) quartz polarizer quarter-wave | 355 |
| Total | 849 |

TABLE II

Mass of Single Laser Diode Array

| Laser System Component | Mass (kg) |
|---|---|
| 1. Diode laser array | 849 |
| 2. Gas Lens | 616 |
| 3. Structure | |
| Zerodur tubes | 1,835 |
| Plexiglass Braces | 311 |
| Backplane | 500 |
| 4. Electrical and coolant feeds | |
| Primary feed | 6 |
| Secondary feed | 9 |
| Individual diode feeds | 18 |
| 5. Thermal heat injection | |
| Radiator | 314 |
| Coolant | 367 |
| Coolant pump | 50 |
| | 114 |
| Total | 4,989 |

Calculations were performed to determine the effect of the gamma and fast neutron effects on the GaAlAs laser device and indicate that the laser diode array will not be severely affected by the low gamma and neutron fluences over the seven-year, full-power reactor lifetime.

Figure 5:
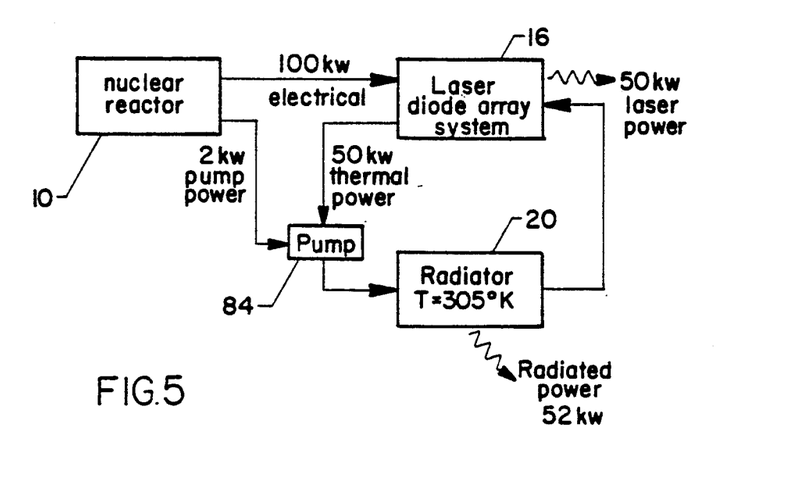
FIG. 5 is a schematic of the satellite power system of use in the present invention.

The reactor produces 100 kW of electrical power for the laser diode array transmitter operating at approximately 50-percent efficiency, producing 50 kW of emitted laser power. System heat (50 kW$_T$) must be radiated away by the 10-m diameter by 4-m long thermal radiator 20 (2.7 kg/m$^2$) operating at 305K. A pump 84, powered by reactor 10, draws the heat from the radiator. FIG. 5 shows a power-flow diagram for the laser-transmitter system. Such a heat-rejection system is described in greater detail in "Heat-Rejection Design for Large Concentrating Solar Arrays," E. P. French, Energy to the 21st Century Proceedings of the 15th IECEC, Vol. 1, 1980, pp. 394–399.

Laser diodes emitting several watts are currently available. The coupling of many such diodes to form a high power, coherent array has not been implemented yet, although much progress has been made in this area. For example, see J. H. Kwon et al., "Far-Field Pattern of a Coherently Combined Beam from Large-Scale Laser Diode Arrays," *J. Applied Phys.*, Vol. 69, pp. 1177–1182, February 1991, and J. P. Van Der Ziel et al., "Characteristics of Single and Two-Dimensional Phase Coupled Arrays of Vortical Cavity Surface Emitting, GaAs-AlGaAs Lasers," *IEEE J. of Q. E.*, Vol. 26, pp. 1873–1882, November 1990.

The purpose of the laser-to-electric converter on the rover is to track the incident laser beam, capture it, and convert it into electricity. Although there are many concepts for converting laser light into electricity, a photovoltaic device was selected because of its high efficiency, low mass, simplicity of operations, and few moving parts.

The emitted laser-beam profile is a square beam which produces a square diffraction-limited pattern at the rover receiver. The pattern length along one side is given by $$D = \frac{m\lambda}{L} Z \quad (1)$$

where m is the diffraction order (m=1,2,3...), λ is the wavelength (0.8 μm), L is the length of one side of the laser-transmitting square aperture (8 m), and Z is the transmission distance having a maximum of 3,100 km and a minimum of 1,800 km. Use of this formula assumes a uniformly illuminated transmission aperture. For illustrative purposes, FIG. 3b is not shown as such an aperture, but in reality would have negligible spacing between output facets. Thus, the central beam spot size will be 0.3 m at 3,100 km and 0.18 m at a 1,800-km transmission distance. This spot size contains 81.5 percent of the total beam power, so the photovoltaic receiver should be larger than this to capture the power in the other lobes of the beam profile. It is interesting to note that only 0.095 kW of solar power is incident on a 0.3-m diameter area.

One characteristic of laser emission is its very narrow frequency spectrum. If the band gap energy of the photovoltaic-converter-material is made (tuned) slightly less than the laser photon energy, then high (approximately 50 percent) laser-to-electric conversion efficiency can be achieved. The conversion process generates heat which must be dissipated, thus the photovoltaic device must be cooled by a circulating cooling fluid. A heat-rejection system is necessary to maintain a converter operating temperature of 320° K.

Figure 6:
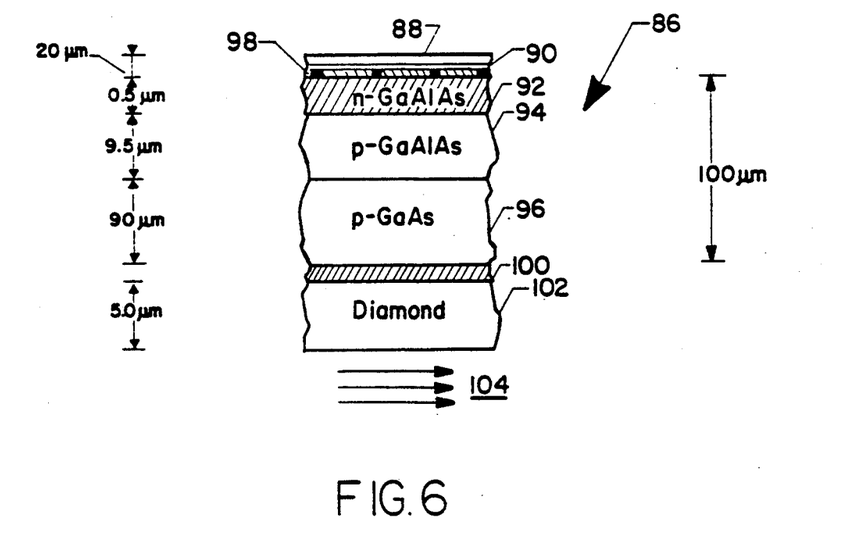
FIG. 6 is an exposed side view of a photovoltaic converter used in the present invention.
Figure 7:
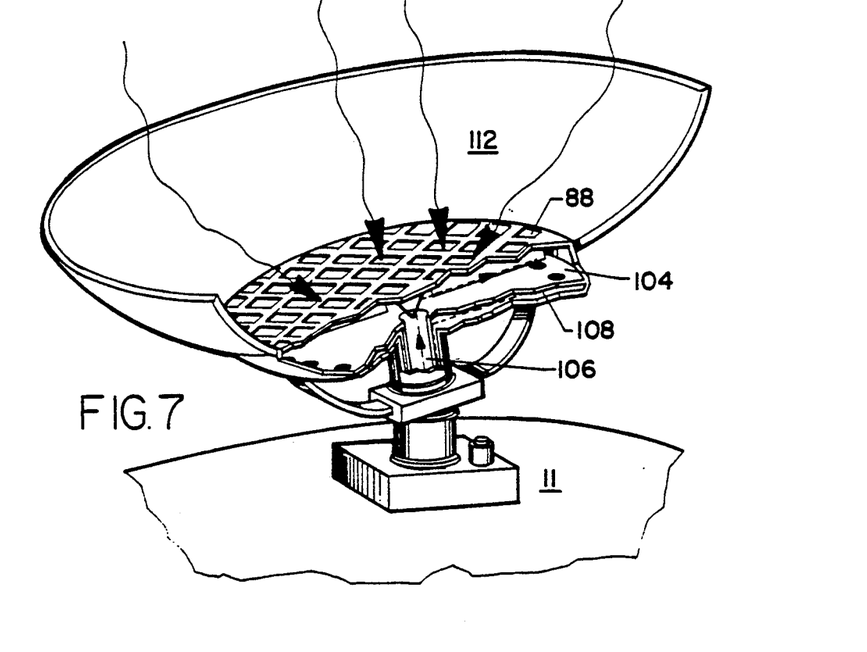
FIG. 7 is a perspective of a laser receiving apparatus used in the present invention having a cutaway view of the cooling chamber.

FIG. 6 shows a cross-sectional view of a photovoltaic device 86 according to the present invention. Laser emission at 0.8 μm is transmitted through a protective cover glass 88 having another reflection coating 90 into the GaAlAs active region which has been tuned for maximum conversion efficiency at 0.8 μm (band-gap energy of 1.55 eV). The region comprises one n-layer 92 of n-GaAlAs and two p-layers 94 and 96 of p-GaAlAs and p-GaAs. The absorption coefficients of GaAs were wavelength-shifted to match a wavelength of 0.80 μm. The absorption coefficients were then used to calculate the converter efficiencies. A known computer code was modified to use these absorption coefficients as well as to allow specification of electron and hole diffusion lengths. The original code can be found in "Summary of Mathematical Models for a Conventional and Vertical Junction Photoconvoltiac," John H. Heinbockel, Progress Report, March-June 1986, NASA Grant NAG-1-148, Old Dominion University. Table III lists the device parameters used in these calculations. Metal contacts 98 and 100 carry the electrical current to the load at the rover. A diamond layer 102 is used to electrically insulate the device from a cooling channel 104 but also to allow good thermal conductivity between the active region and a cooling channel 104. FIG. 7 shows a cutaway view of the laser-to-electric converter as it would appear on the top of the lunar rover 11. Cooling fluid flows up a center tube 106, then is diverted across the converter via cooling channel 104 and through holes of a lower channel 108 back along the outside of cooling tube 106 and onto a thermal radiator 110 (see FIG. 10). The active area diameter is approximately 0.3 m, and a 2-m diameter reflective dish 112 surrounds the active area to refocus stray laser light onto the active area.

TABLE III

| Converter Parameters | |
|---|---|
| Series Resistance (1 cm² device) = | $1 \times 10^{-3}$ ohm |
| Recombination Velocity (n-surface) = | $1 \times 10^{3}$ cm/sec |
| Recombination Velocity (p-surface) = | $1 \times 10^{3}$ cm/sec |
| Acceptor Concentration = | $5 \times 10^{18}$/cm³ |
| Donor Concentration = | $5 \times 10^{17}$/cm³ |
| Junction Depth = | $1 \times 10^{-5}$ cm |
| Thickness = | $1 \times 10^{-3}$ cm |
| Shunt Resistance = | $1 \times 10^{5}$ ohm |
| Electron Diffusion Length = | 7.0 micrometers |
| Hole Diffusion Length = | 3.0 micrometers |
| Electron Mobility = | $4.8 \times 10^{3}$ cm²/v-sec |
| Hole Mobility = | $1.9 \times 10^{2}$ cm²/v-sec |

Figure 8:
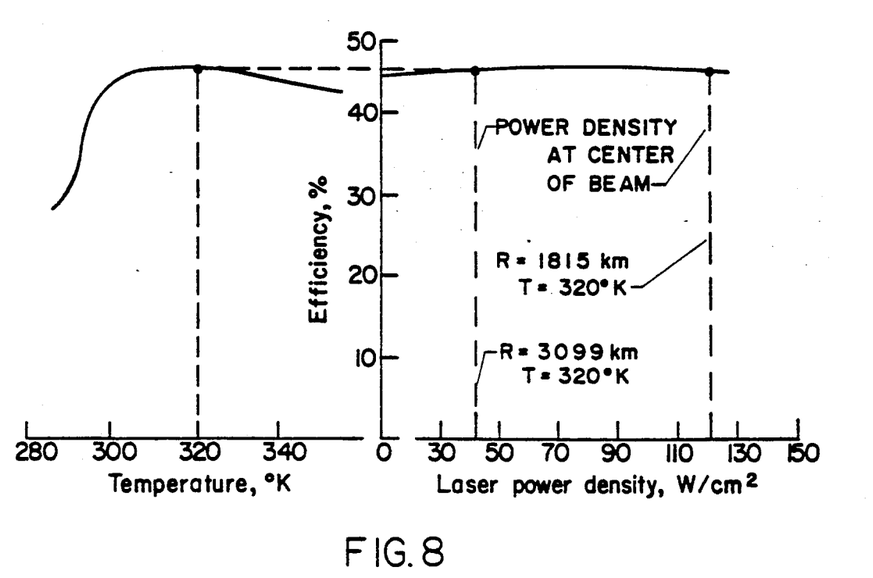
FIG. 8 is a graph showing both the temperature and laser power density versus laser efficiency of the laser to electric converter used in the present invention.
Figure 9:
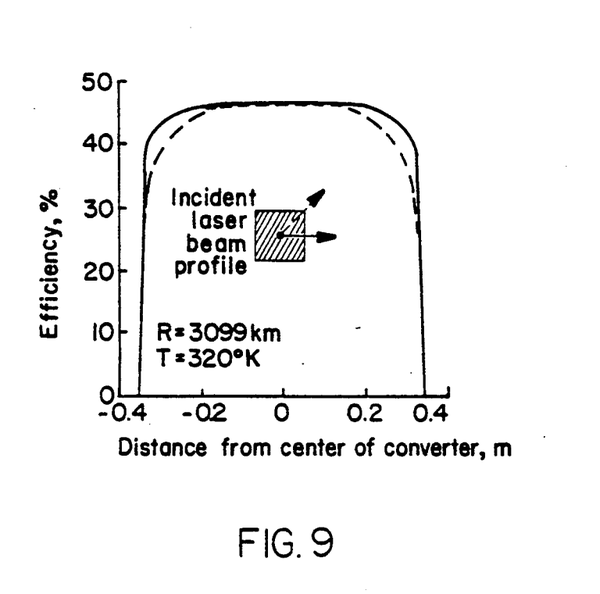
FIG. 9 is a graph showing the efficiency of the laser to electric converter versus position on the collector surface.

FIG. 8 depicts some of the design curves used with this system. The 50-kW incident laser beam produces a power density of 42 W/cm² (at a maximum range of 3,100 km). This power density, and other factors, fix the efficiency at approximately 45 percent and requires the device to be maintained at 320° K. FIG. 9 shows the converter efficiency across the incident laser-beam profile. The efficiency is fairly constant across the beam profile produced at the maximum transmission range of 3,100 km.

Figure 10:
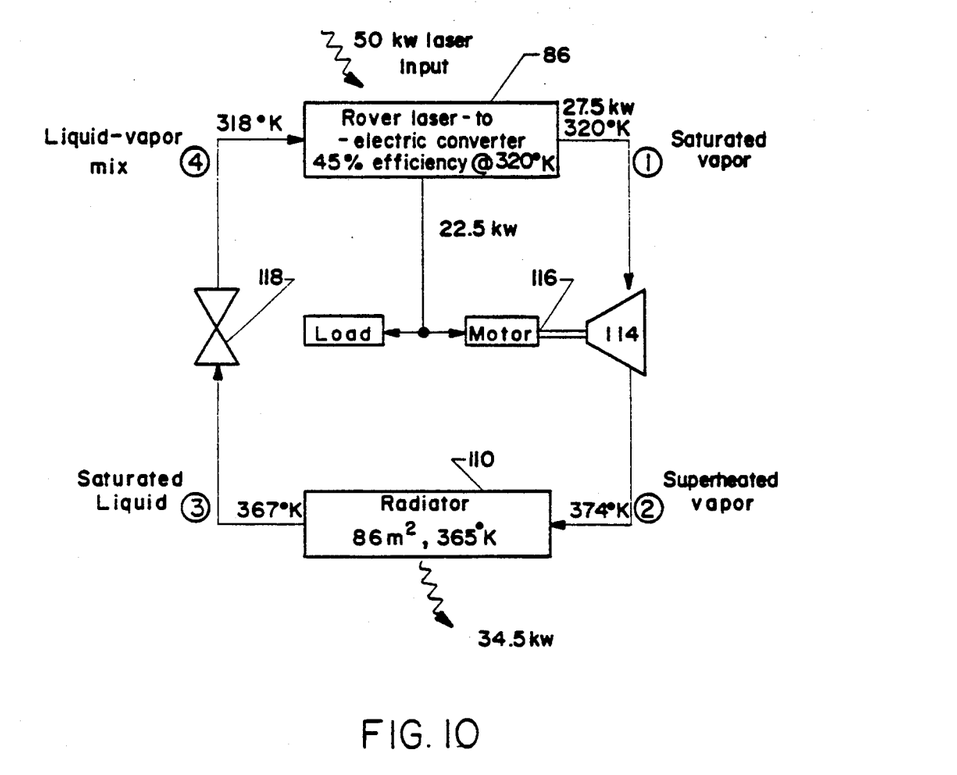
FIG. 10 is a schematic of the laser to electric power conversion system on the device powered according to the present invention.

A heat-rejection system is needed to extract heat (approximately 27.5 kW) from the converter. FIG. 10 is a block diagram of the thermal control system using Freon-12 coolant. A liquid vapor mix (approximately 318° K.) of coolant passes through the coolant channel 104 by the convertor 86. The saturated vapor is then compressed by a Freon-12 compressor 114 driven by a motor 116 which is powered by photovoltaic device 86. The super heated vapor (approximately 374° K.) then passes through thermal radiator 110, which radiates 34.5 kW of heat. The resulting saturated liquid (approximately 367° K.) is passed through an expansion valve 118 and the resulting liquid vapor mix is ready to begin another cycle. Table IV shows the best- and worst-case scenarios. During lunar-day at high noon, the surface temperature is maximum at 370° K. (radiator sink temperature), thus more power must be sent to the compressor (7 kW). At lunar night, the surface is 120° K. (radiator sink temperature), thus only 400 W of compressor power is required, the balance going to the rover load (22.1 kW).

TABLE IV

| Power Requirements of Converter Cooling System | | |
|---|---|---|
| | Compressor | Available |
| Lunar Surface | Work | Power to Rover |
| T (°K.) | (W) | (kW) |
| Lunar Day (Worst Case) 370 | 7000 | 15.5 |
| Lunar Night (Best Case) 120 | 400 | 22 |

The mass of the laser-to-electric power system components is shown Table V. The mass of the photovoltaic device is very small. The major mass component is the thermal radiator with specific mass of 2.7 kg/m². The total power system mass is 520.5 kg, which translates into a specific mass of 21 kg/kW, significantly less than onboard rover power systems studied by others.

TABLE V

| Laser-to-Electric Converter System Mass | |
|---|---|
| Component | Mass (kg) |
| GaAlAs active device and diamond substrate | 0.5 |
| Supporting matrix for active device | 1.0 |
| Laser concentrator | 27.0 |
| Tracking device | 100.0 |
| Coolant piping | 100.0 |
| Radiator (2.7 kg/m²) | 232.0 |
| Compressor/motor | 60.0 |
| | 520.5 |

Safety issues associated with a 0.8-μm laser operated at 42 W/cm² are eye damage, damage to rover vehicle, and spacesuit damage. The laser beam would be optically locked onto the photovoltaic array, and any movement off of the array would be less than several seconds. Spacesuit heating would also be insignificant. To prevent eye damage, all visual windows on the rover or spacesuits would need to be reflectively coated for the 0.8-μm laser wavelength.

The laser system according to the present invention is an array of 5,926 individual laser diode amplifiers producing a total of 50 kW of laser power at 0.8 μm. The electrical input power is derived from a 100-kW electric SP-100 reactor prime power source. Three such laser transmitters would give full-time coverage to a 4000-km lunar rover mission, where laser transmission distances would be between 1,800 and 3,100 km. The mass of one laser transmitter system is approximately 5,000 kg.

The lunar rover would receive a maximum of 50 kW, converting 45 percent (22.5 kW) to electrical power for science, locomotion, heat rejection, and crew needs. The converter is a GaAlAs solid-state converter, operating at 320 K, and having a power system mass of 520 kg. The rover power system would then have a specific mass of 21 kg/kW.

Table VI shows a comparison of the Eagle Engineering fuel-cell powered, long-range rover with the predicted results of the present invention using a laser photovoltaic-powered rover. Both rovers use about 25 kW of power, but the fuel cell rover is limited to a round trip range of 3,000 km, unless additional fuel cell reactant mass is added. Since there are no power system expendables with the laser photovoltaic system, virtually unlimited range can be achieved (dependent primarily on crew needs). Applicants have attempted to define the total laser rover mass, but it would certainly be less than the 17,500 kg fuel cell mass. If a comparison is made between the rover power system only, then the laser rover power system is a factor of 10 below the fuel cell rover. Finally, the prime power sources for the rovers are significantly different. The fuel cell rover demands the placement of an $H_2$-$O_2$ plant on the lunar surface with considerable mass investment. Alternatively, the laser prime power system would be in lunar orbit where it could be more flexibly used. The present invention requires that three laser power stations be placed in lunar orbit having a total mass of 15,000 kg.

TABLE VI

Comparison of Fuel Cell and Laser Photovoltaic Driven Rovers

| | Power (kW) | Round Trip Range (km) | Total Rover Mass (kg) | Rover Power System Mass (kg) | Prime Power Source Mass |
|---|---|---|---|---|---|
| Eagle Engr. Fuel Cell Rover | 25 | 3000 limited by fuel cells | 17,560 | 5,900 | $H_2$—$O_2$ Plant (probable) |
| Laser Photovoltaic Rover | 22 | Not limited by power source | ? | 520 | Three laser transmitter systems in orbit. 15,000 kg total. |

The laser power transmission concept provides a lunar power infrastructure which is highly flexible in its ability to provide power to any point on the lunar surface. The reactor prime power source remains in orbit where it can be safely maintained and easily moved to other orbits for beaming power. Significant mass saving and flexibility is also achieved on the rover using laser power transmission.

Many improvements, modifications and substitutions will be apparent to the skilled artisan without departing from the spirit and scope of the present invention as described herein and defined in the following claims.

We claim:

1. A method of supplying power to a device located on the surface of a planet, comprising the steps of:
   orbiting at least one satellite around the planet, wherein the satellite comprises a nuclear reactor for generating electrical power;
   generating electrical power via the nuclear reactor;
   converting the generated electrical power into a GaAlAs laser beam;
   directing the GaAlAs laser beam from the at least one satellite to the device; and
   converting the power of the GaAlAs laser beam into electrical power for use by the device, said converting step comprising directing the GaAlAs laser beam through a layer of n-GaAlAs semiconductor, through a layer of p-GaAlAs semiconductor, and then through a layer of p-GaAs semiconductor, whereby an electric current is generated.

2. The method according to claim 1, wherein said orbiting step comprises orbiting three satellites having respective nuclear power sources such that at least one of the satellites is always in position to direct a laser beam to the device.

3. The method according to claim 1, wherein the laser beam is passed through a plurality of amplifying arrays prior to said directing step.

4. The method according to claim 1, further comprising the step of cooling the semiconductor layers when the electrical power is generated.

5. The method according to claim 4, wherein said cooling step comprises cycling a coolant fluid past the semiconductor layers, compressing the fluid, passing the fluid through a radiator, and directing the fluid through an expansion valve.

6. The method according to claim 1, further comprising gathering the directed laser beam to a focused area.

* * * * *